(12) United States Patent
Möster et al.

(10) Patent No.: US 6,233,155 B1
(45) Date of Patent: May 15, 2001

(54) ENCAPSULATION OF PRINTED CIRCUIT BOARDS

(75) Inventors: Erik Möster; Paul Larsson; Mats Olsson, all of Malmö ; Olof Simonsson, Lund; Mats Larsson; Rafael Portela, both of Malmö, all of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/324,830

(22) Filed: Jun. 3, 1999

(51) Int. Cl.[7] .................................................. H05K 5/00
(52) U.S. Cl. ..................... 361/752; 361/816; 361/818; 361/827; 379/433; 405/462
(58) Field of Search .................... 361/752, 827, 361/412, 816, 818, 800; 379/433; 405/462

(56) References Cited

U.S. PATENT DOCUMENTS

| | | |
|---|---|---|
| 3,580,650 | 5/1971 | Morris . |
| 4,703,160 | 10/1987 | Narishima et al. . |
| 4,809,875 | 3/1989 | Takano . |
| 4,939,792 | 7/1990 | Urbish et al. . |
| 5,224,023 | * 6/1993 | Smith et al. .......................... 361/412 |
| 5,406,027 | 4/1995 | Matsumoto et al. . |
| 5,432,676 | 7/1995 | Satoh et al. . |
| 5,475,752 | * 12/1995 | Mischenko .......................... 379/433 |
| 5,541,813 | 7/1996 | Satoh et al. . |

FOREIGN PATENT DOCUMENTS

| | | |
|---|---|---|
| 0 547 994 | 6/1993 | (EP) . |
| 1 404 143 | 5/1965 | (FR) . |

* cited by examiner

*Primary Examiner*—Jayprakash N. Gandhi
*Assistant Examiner*—Tuan Dinh
(74) *Attorney, Agent, or Firm*—Burns, Doane, Swecker & Mathis, L.L.P.

(57) ABSTRACT

A housing for electronic components is injection molded as a unitary, single-piece, monolithic piece, and includes a front cover, a back cover, and a living hinge. Electronic components, including a PCB, are contained within the housing. A cosmetic cover is secured to the housing over the living hinge, which protrudes from the housing, to make the housing more appealing.

6 Claims, 1 Drawing Sheet

ENCAPSULATION OF PRINTED CIRCUIT BOARDS

BACKGROUND OF THE INVENTION

1. Field of the Invention

The present invention relates to high-volume production of products having a printed circuit board encapsulated by mechanical shells.

2. Brief Description of the Related Art

Prior products which are formed of a housing which encloses electronic components have typically encapsulated the printed circuit board (PCB) with two plastic parts produced by separate tools. The trimming of the tools is approached in two ways. The two tools are produced in pairs, that is, one supplier or toolmaker is responsible for trimming the two different tools against each other. This approach can offer a good solution to the problem of forming housing to close mechanical and cosmetic tolerances, as it usually guarantees that the parts fit nicely together. Consequently, very tight tolerance requirements can be met. This first solution implies, however, that a significant amount of risk is concentrated with one supplier or toolmaker; if something goes awry with the sole supplier's manufacturing facility or die tools, the entire production of the product stops.

Alternatively, the risk of a significant production stoppage can be spread out among a number of suppliers. In this alternative risk spreading scheme, several different suppliers for the tools produce the housings for the product, i.e., no single one of the suppliers produces a pair of tools. If something goes wrong with any one of the multiple suppliers, the consequences are relatively minor compared with the first solution, outlined above. However, the tolerances between the parts produced by different suppliers must be, by necessity, significantly rougher to assure that the parts will actually fit together. Consequently, the product will more likely have larger gaps between its parts and larger cosmetic mismatches (e.g., structure and color differences between its parts). This can lead, in turn, to malfunctioning of electromechanical connections within the product, and also can result in a final product which is less attractive.

U.S. Pat. No. 4,939,792 describes a moldable/foldable radio housing onto which four solderable printed circuit patterns are vacuum deposited on the interior and exterior of a base and cover, which are joined by a hinge. U.S. Pat. No. 4,703,160 describes a casing structure of a portable electronic appliance, in which four panels are joined by hinges and are releasably attached when folded together. U.S. Pat. Nos. 5,432,676 and 5,541,813 describe a portable telephone having a case with a wiring member in a molded plastic hinge, in which the hinge is opened and closed during regular use, and the hinge is formed of a material different from that used to form the rest of the case. U.S. Pat. No. 3,580,650 describes a cabinet for holding, e.g., a complete radio, in which four sections are joined together by hinges that can be opened and closed during regular use. EP 547 994 A1 describes a stamped sheet of metal which is folded upon itself and joined with tabs to form a housing. None of these prior devices resolve the problems outlined above.

SUMMARY OF THE INVENTION

The present invention provides a solution to the problems associated with outsourcing and the spreading of risks among a number of different suppliers of housings for electronic components, and the tolerances of the parts produced.

In its simplest form, the basic problem is to encapsulate and secure a PCB in and by injection-molded mechanical shells in an assembly procedure requiring as few and as simple operations as possible, and with a minimum number of mechanical shells required to form the completed product. The greater number of mechanical shells that is needed to form the product, the greater the number of injection-molding tools that must be trimmed against each other so that these parts fit together. Trimming of tools against each other can be crucial in high-volume production, where the production of each plastic part might require a large number of tools, e.g., up to twenty similar tools.

Choosing between the two different solutions outlined above presents a major dilemma to any company facing the basic problem of mass-producing a housing which encloses a PCB, since neither of these two solutions are optimized with respect to both risk spreading and tolerances.

In accordance with the present invention, a solution to the problem, as well as to the dilemma, described above is to injection mold the two plastic parts of a housing, e.g., the back and front covers, as one single, unitary, monolithic, unitary piece. In accordance with an exemplary embodiment of the present invention, the back and front covers can be connected by a "living hinge" which is formed of the same material and at the same time as the covers are formed.

Thus, an exemplary embodiment of an assembly process in accordance with the present invention includes the steps of inserting the PCB and other components of the product into the back and front covers. Encapsulation of the PCB and other product components is achieved when either the back or the front cover is rotated 180° relative to the other cover about a hinge, thereby enveloping the PCB and components. The joined covers can be secured by means of screws, snap fits, ultrasonic welding, or other relatively permanent processes. Because the hinge could then extend out of the closed housing, which may be aesthetically and commercially unacceptable, a cosmetic cover can be joined to the exterior of the housing to mask, cover, or otherwise hide the hinge.

The present invention can thus essentially eliminate the necessity of trimming tools against one another, as was needed with prior devices and processes. And, different from prior solutions, the present invention facilitates the combination of risk spreading and the optimization of tolerances.

Still other objects, features, and attendant advantages of the present invention will become apparent to those skilled in the art from a reading of the following detailed description of embodiments constructed in accordance therewith, taken in conjunction with the accompanying drawings.

BRIEF DESCRIPTION OF THE DRAWINGS

The invention of the present application will now be described in more detail with reference to preferred embodiments of the apparatus and method, given only by way of example, and with reference to the accompanying drawings, in which.

DESCRIPTION OF THE PREFERRED EMBODIMENTS

Figure 1:
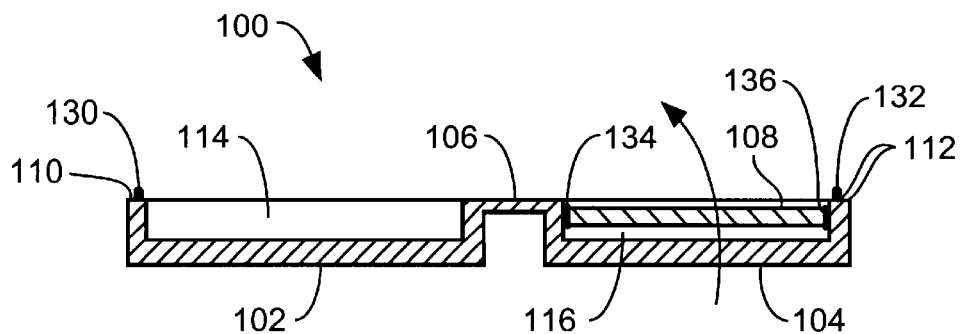
FIG. 1 is an illustration of a transverse cross-sectional view of a housing in accordance with the present invention.

Referring to the drawing figures, like reference numerals designate identical or corresponding elements throughout the several figures.

FIG. 1 illustrates a transverse cross-sectional view of a first exemplary embodiment in accordance with the present invention. Housing 100 includes a front cover portion 102, a back cover portion 104, and a hinge portion 106 between the front cover and back cover. A PCB 108 is securely mounted in one of front cover 102 and back cover 104 by securing elements 134, 136 which will be readily apparent to one of ordinary skill in the art. While FIG. 1 illustrates PCB 108 being initially mounted to back cover 104, the PCB can readily be mounted to front cover 102 within the scope of the present invention. Front cover 102 includes a cavity 114, and back cover 104 includes a cavity 116, which contain components of the electronic device of which housing 100 forms a part.

Figure 2:
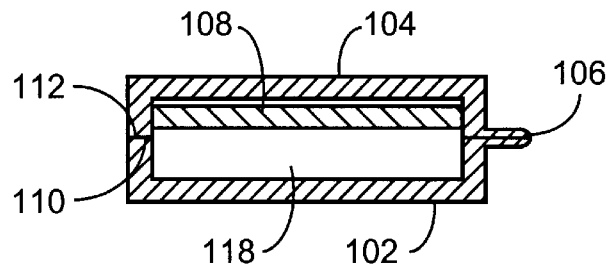
FIG. 2 is an illustration of a transverse cross-sectional view of the housing illustrated in FIG. 1 in a closed configuration.

Front cover 102 includes an outer edge 110, and back cover 104 includes an outer edge 112, on a lateral side of the cover opposite hinge 106. As illustrated in FIG. 2, when housing 100 is closed, that is, when back cover 104 and front cover 102 are rotated relative to and toward each other so that cavity 114 and cavity 116 come together to form a housing cavity 118, outer edges 110, 112 meet. In order to secure housing 100 in this closed position, illustrated in FIG. 2, edges 110, 112 are provided with elements 130, 132 which secure the two covers together, preferably in a non-releasable manner, such as screws, snap-fit devices, an ultrasonic weld, or any other suitable element or method of joining together the edges of the covers which provides a strong, and preferably non-releasable, joint.

Housing 100 can be formed of any one of suitable materials. In order to form front cover 102, back cover 104, and hinge 106 together to take advantages of the present invention, housing 100 is injection molded from a single tool, that is, in a single mold. Therefore, front cover 102, back cover 104, and hinge 106 are formed of the same material, and together form a single-piece, unitary, and monolithic housing. Hinge 106 is therefore preferably a living hinge, formed by a thinned out section of the housing material. As will be readily apparent to one of ordinary skill in the art, housing 100 can be molded of any one of numerous materials, and is selected to be relatively durable and electrically non-conductive as a housing for electronic components, capable of accommodating the elements which secure edges 110, 112 together and the elements which secure PCB 108 to the housing, and which is elastic enough that a living hinge 106 can be formed by thinning material of the housing.

Figure 3:
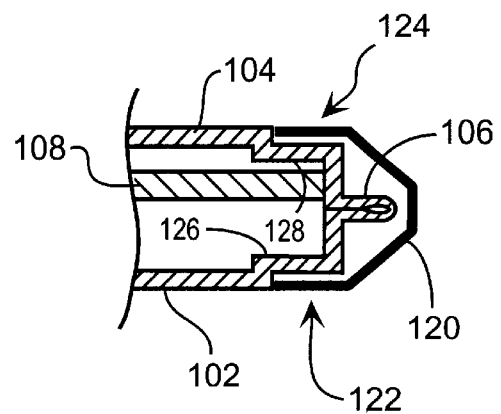
FIG. 3 is an enlarged illustration of a portion of the housing illustrated in FIG. 2.

As illustrated in FIGS. 2 and 3, when housing 100 is in its closed position, hinge 106, because it is a living hinge formed integrally with front cover 102 and back cover 104, protrudes from the housing. While in some applications a protruding hinge 106 is not objectionable, in consumer-oriented applications, such as portable cellular telephone handsets, the protruding hinge can be perceived as unsightly and commercially unacceptable. A cosmetic cover 120 can therefore be provided in order to mask hinge 106. Cover 120 preferably extends along housing 100 to cover the entire hinge 106 along its length. Cover 120 is mounted at least one of front cover 102 and back cover 104, and preferably to both covers, in regions 122, 124 of the front and back covers, respectively, adjacent to hinge 106. In order to allow cover 120 to be flush-mounted to front cover 102 and/or back cover 104, the front and/or back cover includes a notch 126, 128, respectively, so that cosmetic cover 120 does not protrude above the surfaces of the front and back covers. Cosmetic cover 120 is attached to front cover 102 and/or back cover 104 by any suitable element, including adhesive, tape, snap-fit elements, ultrasonic welding, or the like.

While the invention has been described in detail with reference to preferred embodiments thereof, it will be apparent to one skilled in the art that various changes can be made, and equivalents employed, without departing from the scope of the invention.

What is claimed is:

1. A housing useful for containing electronic components comprising:

a front cover having a cavity;

a back cover having a cavity;

a living hinge connecting said front cover and said back cover; and a cosmetic cover mounted to at least one of said front cover and said back cover, said cosmetic cover overlying said living hinge when said front cover and said back cover are closed together with said front cover cavity and said back cover cavity together;

wherein said front cover, said back cover, and said living hinge are formed of the same material and are a unitary, single-piece, monolithic piece formed by injection molding.

2. A housing in accordance with claim 1, further comprising a printed circuit board mounted in one of said front cover cavity and said back cover cavity.

3. A housing in accordance with claim 1, wherein said front cover includes an edge opposite said living hinge, and said back cover includes an edge opposite said living hinge, each of said edges including mating securing elements which, when said front cover and said back cover are rotated toward and relative to each other, cooperate to hold said front cover edge and said back cover edge together.

4. A housing in accordance with claim 1, wherein said front cover includes an edge opposite said living hinge, and said back cover includes an edge opposite said living hinge, wherein said front cover edge is joined to said back cover edge, and said living hinge protrudes away from said housing.

5. A housing in accordance with claim 1, wherein at least one of said front cover and said back cover includes a notch adjacent to said living hinge in which said cosmetic cover is mounted flush with said at least one of said front cover and said back cover.

6. A housing in accordance with claim 5, wherein both of said front cover and said back cover include notches adjacent to said living hinge.

* * * * *